US007585771B2

(12) United States Patent
Matsuda et al.

(10) Patent No.: US 7,585,771 B2
(45) Date of Patent: Sep. 8, 2009

(54) METHOD OF MANUFACTURING SEMICONDUCTOR DEVICE

(75) Inventors: Tomoko Matsuda, Kanagawa (JP); Takamasa Itou, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 131 days.

(21) Appl. No.: 11/409,061

(22) Filed: Apr. 24, 2006

(65) Prior Publication Data

US 2006/0240667 A1 Oct. 26, 2006

(30) Foreign Application Priority Data

Apr. 25, 2005 (JP) ............................ 2005-127107
Apr. 11, 2006 (JP) ............................ 2006-108914

(51) Int. Cl.
*H01L 21/4763* (2006.01)
*H01L 21/44* (2006.01)

(52) U.S. Cl. .............. 438/682; 438/597; 257/E21.199; 257/E21.2; 257/E21.296

(58) Field of Classification Search .................. 438/48, 438/55, 64, 106, 455, 597, 682; 257/E21.296, 257/E21.2, E21.199
See application file for complete search history.

(56) References Cited

U.S. PATENT DOCUMENTS 5,780,361 A * 7/1998 Inoue ......................... 438/683
2002/0098692 A1* 7/2002 Miura ........................ 438/682
2003/0183897 A1* 10/2003 Ballantine et al. ........... 257/467
2005/0059242 A1* 3/2005 Cabral et al. ................ 438/682
2006/0014388 A1* 1/2006 Lur et al. .................... 438/683

FOREIGN PATENT DOCUMENTS

JP 10-256191 9/1998
JP 2000-243726 9/2000

OTHER PUBLICATIONS

"2.2 Formation of epitaxial TM silicides," L.A. Clevenger et al., Jun. 1995, pp. 61-70.
"2004 Handotai Tekunoroji Taizen," Semiconductor Technology Outlook, 2004, pp. 384, Electronic Journal, Inc., Tokyo, Japan.
M.J.H. van Dal et al., "The relation between phase transformation and onset of thermal degradation in nanoscale $CoSi_2$-polycrystalline silicon structures", Journal of Applied Physics, vol. 96, No. 12, Dec. 15, 2004, pp. 7568-7573.

* cited by examiner

*Primary Examiner*—Alexander G Ghyka
*Assistant Examiner*—Seahvosh J Nikmanesh
(74) *Attorney, Agent, or Firm*—Young & Thompson

(57) ABSTRACT

Method for manufacturing a semiconductor device, includes: forming a layer of dicobalt monosilicide ($Co_2Si$) or of cobalt (Co) on a device-forming surface of a silicon substrate in a sputter apparatus, by utilizing a predetermined temperature profile; elevating a temperature of the silicon substrate to a predetermined temperature T2, which is equal to or higher than 600° C., conducted after forming the layer of Co or $Co_2Si$; and forming a layer of monocobalt monosilicide (CoSi) on the device-forming surface of the silicon substrate at a temperature equal to or higher than T2, conducted after heating the silicon substrate to T2, wherein, the silicon substrate is elevated to a temperature between a highest reachable temperature T1 of the silicon substrate during forming the layer of Co or $Co_2Si$ and the temperature T2 at a temperature ramp rate of equal to or higher than 50° C./sec.

8 Claims, 13 Drawing Sheets

METHOD OF MANUFACTURING SEMICONDUCTOR DEVICE

This application is based on Japanese patent application No. 2005-127,107 and Japanese patent application No. 2006-108,914, the contents of which are incorporated hereinto by reference.

BACKGROUND

1. Technical Field

The present invention relates to a method for manufacturing a semiconductor device comprising a layer of cobalt silicide.

2. Related Art

Among conventional methods for manufacturing semiconductor devices, a method for manufacturing a semiconductor device having a layer of titanium silicide formed on a silicon substrate is typically described in Japanese Patent Laid-Open No. H10-256,191 (1998). Resistances in electrodes such as a gate or source/drain can be reduced by providing the titanium silicide layer, like the above-described configuration. In recent years, a layer of cobalt silicide is employed, in place of a layer of titanium silicide, according to requirements for achieving faster operation of a device. Such cobalt silicide layer may be formed within a furnace annealing apparatus or a lamp annealing apparatus.

Among conventional technologies for forming a cobalt silicide layer, a process is typically described in Japanese Patent Laid-Open No. 2000-243,726. In the process described in Japanese Patent Laid-Open No. 2000-243,726, a cobalt film is first sputter deposited at a temperature of around 200 degree C. Thereafter, the cobalt film is heated within another sputter chamber at a temperature within a range of from 300 degree C. to 400 degree C. for two minutes or longer, without exposing the film to atmospheric air. It is described in the above-described disclosure that this procedure helps accelerating a nuclear growth of a dicobalt monosilicide ($Co_2Si$) film, thereby promoting a crystallization thereof. It is also described in the above-described disclosure that a transistor manufactured via this process exhibits a reduced layer resistance in a p-type electrode of the transistor, as compared with a case of conducting a high-temperature sputter process at a temperature of around 450 degree C.

SUMMARY OF THE INVENTION

However, when the furnace annealing apparatus is employed, technical issues such as an increased sheet resistance of the cobalt silicide layer, an enhancement of a junction leakage current and the like arise. The present inventors have obtained a scientific knowledge that such issues result from a slower temperature ramp rate in the furnace annealing apparatus.

Further, shallower diffusion depth for a diffusion layer formed in a silicon substrate is required in recent years.

It has been found that these issues as described above are correspondingly created even in a case of employing a lamp annealing apparatus that can achieve faster temperature ramp rate. There is a room for an improvement in terms of the above-described issues in the technology disclosed in Japanese Patent Laid-Open No. 2000-243,726, which has been described in the background.

The above-described problems occurred when a cobalt silicide layer is formed in a lamp annealing apparatus will be further described in detail below. The lamp annealing apparatus employed here comprises a temperature measurement unit for measuring a temperature of a silicon substrate by utilizing optics.

First of all, cobalt is deposited on a surface of a silicon substrate having a gate electrode formed thereon, via an ordinary sputter process. Then, the silicon substrate is heated with a heating lamp to commence an annealing process (first sinter). The first sinter is conducted, while confirming a temperature of the silicon substrate, with a temperature measurement unit such as a pyrometer and the like, after heating the silicon substrate to a predetermined temperature. After completing the first sinter, an additional annealing process (second sinter) is further conducted to form a layer of cobalt silicide on the surface of the silicon substrate.

The annealing process (first sinter) within such lamp annealing apparatus is typically conducted to conform a temperature profile shown in FIG. 6. The temperature profile show in FIG. 6 is a temperature profile of the silicon substrate obtained by employing a pyrometer.

The process for forming such cobalt silicide layer specifically comprises:

(a) elevating the temperature of the silicon substrate to a temperature within a range of from about 450 degree C. to 500 degree C., without conducting any temperature control;

(b) after the operation of the above (a), holding the temperature of the silicon substrate within a range of from about 450 degree C. to 500 degree C. for about several seconds;

(c) after the operation of the above (b), further elevating the temperature of the substrate to a temperature around 700 degree C.;

(d) after the operation of the above (c), holding the temperature of the silicon substrate at a temperature of around 700 degree C. for about 30 seconds; and (e) after the operation of the above (d), cooling the silicon substrate to a predetermined temperature.

The aforementioned operation (a) is a process for elevating the temperature of the silicon substrate to a previously fixed temperature without conducting any feedback operation (open loop control). On the contrary, the aforementioned operations (b) to (d) are processes, which includes conducting the temperature control by measuring the temperatures of the silicon substrate with a pyrometer and feeding back the measured temperatures (closed loop control).

As described above, for a transition from the operation (a) to the operation (c), the temperature-holding operation (b) for stabilizing the temperature of the silicon substrate at a temperature within a range of from 400 degree C. to 550 degree C. is required. An operation for holding a temperature of a silicon substrate is typically required in a process utilizing a lamp annealing apparatus (2004 Handotai Tekunoroji Taizen (Semiconductor Technology Outlook, 2004), pp. 384, Electronic Journal, Inc., Tokyo Japan). Such operation is required by the following reasons.

Annealing processes are conducted for different types of wafers having various structures according to a common temperature profile in the lamp annealing apparatus. This temperature profile is also applicable to a silicon substrate having an unprocessed surface. Infrared light is usually used in this temperature measurement. The temperature, at which a temperature measurement for the silicon substrate can be conducted by a pyrometer, is the highest, when a silicon substrate having an unprocessed surface is employed. More specifically, the temperature is within a range of from about 400 degree C. to about 500 degree C., at which the transmissivity of the silicon substrate to light is lost. Because the silicon substrate is transparent less than 400 degree C., the temperature of the substrate can not be measured precisely. Therefore, an ordinary lamp annealing apparatus typically employs a temperature profile having a portion, in which an increase of temperature is temporarily stopped at around 450 degree C. to around 500 degree C., so as to be applicable to a silicon substrate having an unprocessed surface. A precise temperature measurement can be conducted within such range of the temperature, regardless of type of a silicon substrate, thereby achieving a suitable annealing process. In addition, the temperature of the silicon substrate is held for a predetermined time as described above, for the purpose of stabilizing the temperature of the silicon substrate at a transition from the operation (a) of elevating the temperature of the substrate without conducting a temperature control to the operation (c) for elevating the temperature of the substrate under a control of the temperature of the silicon substrate by pyrometer. Having such procedure, precise control in the temperature of the silicon substrate can be achieved in the operation (c).

However, it has been clarified in recent years that the operation for holding the temperature of the silicon substrate within such temperature range causes an increase in the sheet resistance of the obtained silicide layer, or an increase of a junction leakage current. Although these issues did not manifest themselves in the conventional semiconductor device, the issues have arisen when providing a shallow diffusion depth of the diffusion layer in the silicon substrate.

The present inventors have eagerly studied these issues, and eventually have found a scientific knowledge that mono cobalt mono silicide (CoSi) having higher electric resistance is formed when the temperature of the silicon substrate is held within such temperature range, so that the sheet resistance thereof is increased. Relationship between the annealing temperature and the electric resistance of the silicide layer will be described below.

Results of the measurements in the sheet resistances of the silicide layer, which is formed by annealing the silicon substrate having cobalt deposited via a sputter process at a temperature within a range of from 400 degree C. to 550 degree C., is shown in FIG. 7 The silicon substrate employed here is formed by sputtering cobalt at 400 degree C. As shown in FIG. 7, it is confirmed that sheet resistance of the silicide layer particularly increased, when the silicon substrate is annealed at a temperature within a range of from 450 degree C. to 500 degree C. Such increase in the sheet resistance is considerable when the silicide layer is formed on an n-type diffusion layer of an n-type transistor.

On the contrary, the increase of in the junction leakage current is resulted from the fact that, when the silicon substrate is held to be at such temperature range, an unusual reaction between cobalt and silicon from the silicon substrate is caused, leading to generations of silicide-spikes (locally fast silicidation reaction) and/or cohesions in the diffusion layer. That is, in the device structure having shallow location for the diffusion employed in recent years, a distance from a silicide layer to a junction is short, leading to easily cause an enhancement in the junction leakage current by the unusual reaction. Such junction leakage current is considerably increased when a silicide layer is formed on a p-type diffusion layer of a p-type transistor.

As described above, the increase in the sheet resistance of the cobalt silicide layer or the enhancement of the junction leakage current is considerable particularly in recent semiconductor devices having shallower diffusion depth of a diffusion region.

According to one aspect of the present invention, there is provided a method for manufacturing a semiconductor device, comprising: forming a layer of cobalt (Co) or a layer of dicobalt monosilicide ($Co_2Si$) on a device-forming surface of a silicon substrate in a sputter apparatus, by utilizing a predetermined temperature profile; after the forming the layer of Co or $Co_2Si$, elevating a temperature of the silicon substrate to a predetermined temperature T2, which is equal to or higher than 600 degree C.; and after the heating the silicon substrate to T2, forming a layer of monocobalt monosilicide (CoSi) on the device-forming surface of the silicon substrate at a temperature within a range of equal to or higher than T2, wherein, in the elevating the temperature of the silicon substrate to T2, within a temperature range between a highest reachable temperature T1 of the silicon substrate in the forming the layer of Co or $Co_2Si$ and the temperature T2, a temperature of the silicon substrate is elevated at a temperature ramp rate of equal to or higher than 50 degree C./sec.

In this method, a temperature of the silicon substrate is elevated within a temperature range between highest reachable temperature T1 of the silicon substrate in the forming the layer of Co or $Co_2Si$ and the temperature T2 at a temperature ramp rate of equal to or higher than 50 degree C./sec, in the second operation of elevating the temperature of the silicon substrate to T2. This ensures inhibiting an unusual reaction of CoSi such as a silicide-spike or a cohesion.

Significances of the temperature T1, the temperature T2 and the temperature ramp rate of 50 degree C./sec. will be described below.

First of all, the temperature T1 is described. T1 is a highest reachable temperature of the silicon substrate in the first operation of forming the layer of Co or $Co_2Si$. In the temperature range of equal to or lower than T1, which is once attained in the first operation, no unusual reaction is created even if the substrate is heated in the second operation again. On the contrary, concerning a temperature range of higher than T1, which is a temperature range exceeding the temperature for heating in the first operation, the temperature control in the temperature higher than T1 is critical for inhibiting unusual reaction. In the second operation, it is necessary to rapidly heat the silicon substrate to smoothly pass the heating course through the range of the temperature, at which unusual reaction is caused, which is higher than T1.

Next, description of T2 will be made. In formation reaction of CoSi, the temperature range, in which causing the unusual reaction is an issue, is a temperature range of less than T2. CoSi layer is rather stably formed in the temperature range of is equal to or higher than T2.

According to the investigation of the present inventors, it is found that suitable conditions for forming CoSi may be changed, depending on the conditions of an underlying base such as a junction depth of a diffusion layer formed in the silicon substrate, and also empirically found that unusual reaction is inhibited when T2 is set to a temperature of equal to or higher than 600 degree C., regardless of the conditions of the underlying base. When the condition for heating the silicon substrate is controlled in the second operation, it is sufficient to control the temperature rising rate for the temperature range of at least up to T2 as a safe temperature region, so that unusual reaction of CoSi can be inhibited, regardless of the conditions of the underlying base.

Next, description of the significance of the temperature ramp rate of 50 degree C./sec. will be made. According to the investigation of the present inventors, it is empirically found that unusual reaction caused in the process for forming CoSi can be effectively inhibited by elevating the temperature of the silicon substrate at a rate of equal to or higher than 50 degree C./sec., as discussed later in the description of examples.

As such, the present invention is configured that the temperature of the silicon substrate is elevated at a rate of equal to or higher than 50 degree C./sec., when the temperature of the silicon substrate is within a temperature range of from T1 to T2, in which unusual reaction in the formation of CoSi is easy to be created, so that the unusual reaction can be effectively inhibited, regardless of the conditions of the underlying base. Thereafter, the third operation is conducted according to the temperature profile, in which the temperature thereof is equal to or higher than T2 for achieving a stable formation of CoSi layer, so that the process for forming cobalt silicide onto the device-forming surface of the silicon substrate can be stably conducted. Therefore, according to the present invention, an increase in the sheet resistance of the cobalt silicide layer due to the unusual reaction of CoSi or an enhancement in the junction leakage current can be inhibited, thereby reducing a decrease in a production yield of semiconductor devices.

While CoSi layer is formed primarily in the third operation in the above-described configuration according to the present invention, CoSi may be formed onto the device-forming surface of the silicon substrate alternatively in the second operation, if the unusual reaction described above can be inhibited to achieve a level of the inhibition that provides a practical use of the device. In addition, in the third operation, $CoSi_2$ may be formed in some region of the surface of the silicon substrate, According to another aspect of the present invention, there is provided a method for manufacturing a semiconductor device, comprising: depositing cobalt on a surface of a silicon substrate by sputtering method (for example); and heating the silicon substrate with a lamp annealing apparatus to form a layer of cobalt silicide, the lamp annealing apparatus comprising a temperature measurement unit that is capable of optically measuring a temperature of the silicon substrate, wherein the heating the silicon substrate with the lamp annealing apparatus to form the layer of cobalt silicide includes: elevating the temperature of the silicon substrate to a first temperature, at which a temperature measurement of the silicon substrate having a layer of cobalt deposited thereon is enabled to be conducted by employing the temperature measurement unit; holding the temperature of the silicon substrate at around the first temperature to stabilize the temperature of the silicon substrate; and elevating the temperature of the silicon substrate to a second temperature that is equal to or higher than the first temperature.

According to the above-described aspect of the present invention, in the lamp annealing apparatus including the temperature measurement unit that is capable of optically measuring a temperature of the silicon substrate, the temperature of the silicon substrate is elevated to the first temperature, at which a temperature measurement of the silicon substrate having the layer of cobalt deposited thereon is enabled to be conducted, and then, the temperature of the silicon substrate is held at around the first temperature to stabilize the temperature of the silicon substrate. Employing the silicon substrate which accumulated with the surface of the substrate with cobalt can reduce the temperature, at which the temperature measurement of the silicon substrate is enabled to be conducted with the temperature measurement unit, as compared with the case of employing the silicon substrate having the unprocessed surfaces. Having such configuration, the operation of holding the temperature of silicon substrate can be carried out according to a substantially flat temperature profile that does not exceed the temperature, at which an unusual reaction is induced between cobalt and silicon. Therefore, the obtained sheet resistance of the silicide layer is reduced, and further, any silicide-spike or cohesion is not generated in the diffusion layer, leading to an inhibition in the generation of the junction leakage current.

According to the present invention, a method for manufacturing a semiconductor device is provided, which promotes a reduced sheet resistance of a silicide layer and further a reduced generation of the junction leakage current.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be presented.

FIRST EMBODIMENT

Figure 8:
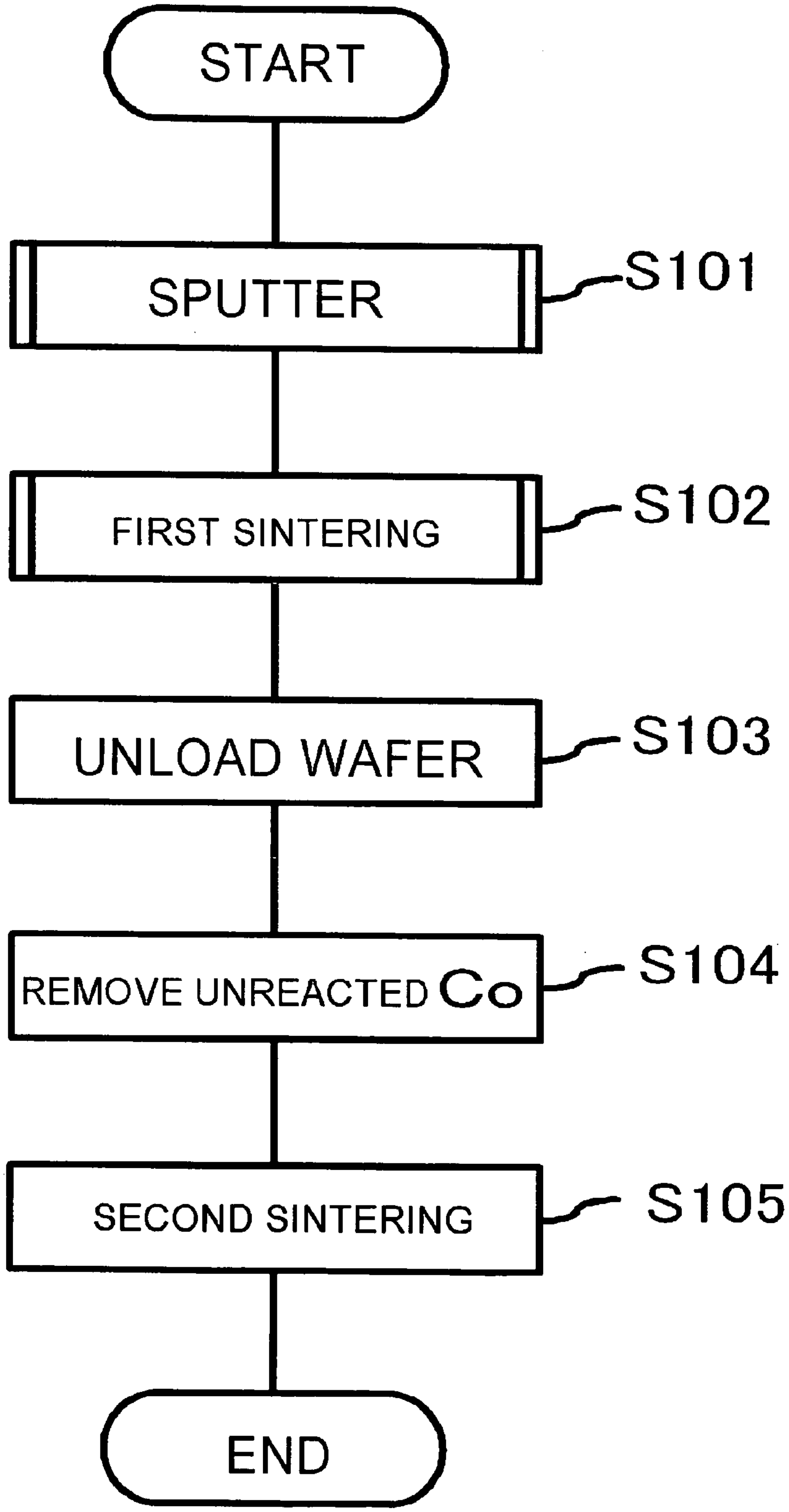
FIG. 8 is a flow chart, illustrating a procedure for manufacturing a semiconductor device according to an embodiment of the present invention.

In the present embodiment, an exemplary implementation of employing a silicon wafer as the silicon substrate will be described. FIG. 8 is a flow chart, showing a procedure for manufacturing a semiconductor device in the present embodiment. The silicide layer is formed on the silicon substrate such as silicon wafer and the like according to the procedure of FIG. 8, so that semiconductor devices having a predetermined device such as transistor and the like can be manufactured by employing this procedure.

A procedure for manufacturing of FIG. 8 includes the following steps;

step 101: sputter;

step 102: first sintering;

step 103: unloading wafer;

step 104: removing unreacted Co; and step 105: second sintering.

Figure 9:
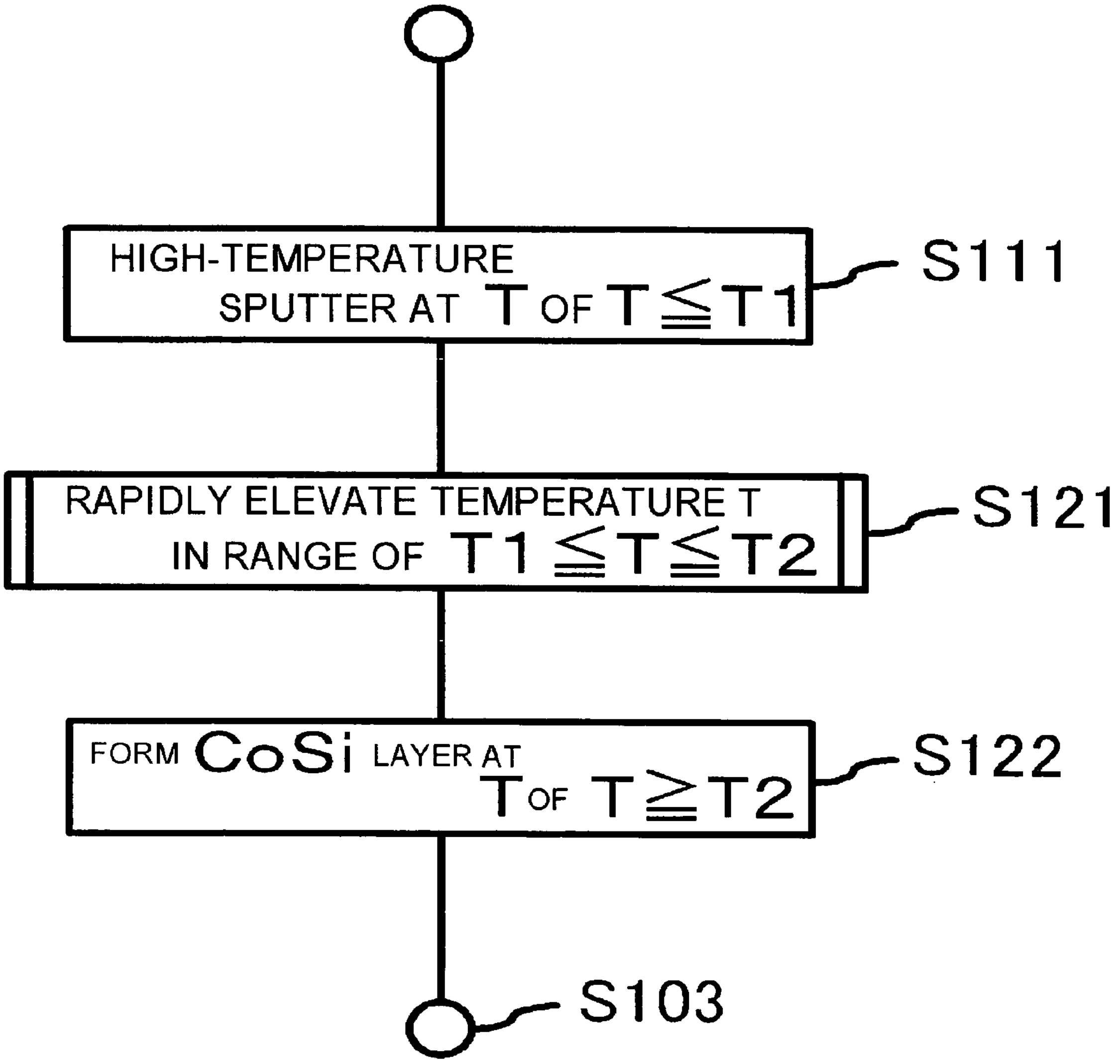
FIG. 9 is a flow chart, illustrating a procedure for manufacturing the semiconductor device according to the embodiment of the present invention.
Figure 12:
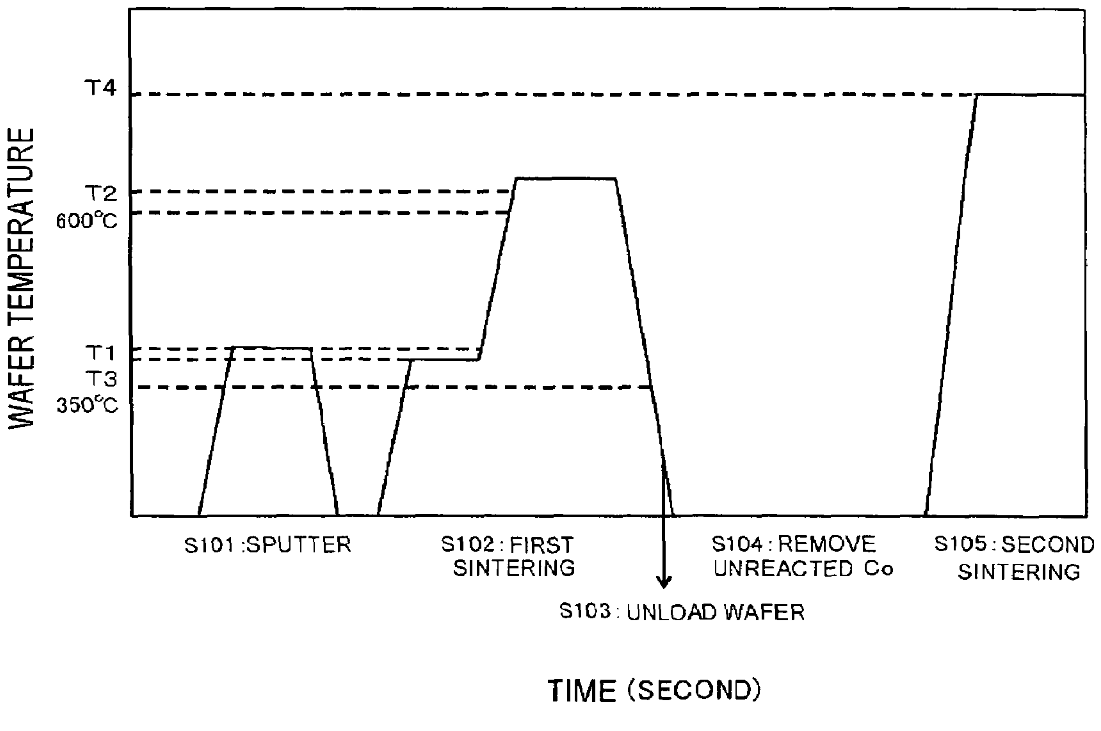
FIG. 12 is a graph, illustrating a procedure for manufacturing the semiconductor device according to the embodiment of the present invention.

FIG. 9 is also a flowchart, showing a part of the manufacturing procedure shown in FIG. 8, and more specifically, describing the step 101 and the step 102 in detail. FIG. 12 is a graph, showing a temperature profile of the silicon wafer in the process for forming the silicide layer in the present embodiment. Each step will be described below in detail, in reference to FIG. 8, FIG. 9 and FIG. 12.

A sputter operation of step 101 is a first operation for forming a layer of Co or a layer of $Co_2Si$ on a device-forming surface of a silicon substrate in a sputter apparatus in accordance with a predetermined temperature profile. This operation is, for example, a high-temperature sputter operation conducted at a predetermined temperature of equal to or lower than T1 (S111 in FIG. 9).

In the high-temperature sputter operation of the step 111, Co is deposited on the device-forming surface of the silicon substrate in a temperature range of, for example, from (T1−50) degree C. to T1. Having such procedure, at least a portion of Co in the Co layer reacts with silicon in the substrate, to stably form $Co_2Si$ on the device-forming surface. More specifically, Co is deposited on the device-forming surface of the silicon substrate at a predetermined temperature within a range of not lower than 300 degree C. and not higher than 400 degree C. to form the Co layer.

The first sintering operation of step 102 includes: a second operation (S121 of FIG. 9) of elevating the temperature of the silicon substrate to achieve the temperature thereof at a predetermined temperature T2 of equal to or higher than 600 degree C., conducted after the first operation; and a third operation (S122 of FIG. 9) of forming a CoSi layer on the device-forming surface of the silicon substrate in a temperature range of equal to or higher than the temperature T2, conducted after the second operation. The step 121 and the step 122 are conducted in, for example, a lamp annealing apparatus. The step 121 and the step 122 may be sequentially conducted within one lamp annealing apparatus. This can provide forming the CoSi layer with an improved efficiency.

In the step 121, the temperature of the silicon substrate is elevated at a rate of be equal to or higher than 50 degree C./sec. within a temperature range of from the highest reachable temperature T1 of the silicon substrate in the first operation to the temperature T2 within an elevating temperature profile.

'At the rate of 50 degree C./sec.' is, for example, to elevate the temperature from 300 degree C. to 600 degree C. in 6 seconds. More specifically, the temperature setting is given by inputting into an apparatus setting values of temperatures of 300 degree C. to start reading and 600 degree C. Further, for stopping at 600 degree C., in terms of preventing overheating, the temperature to be inputted into the apparatus may be set to 590 degree C., or a controller may be switched.

The rate of temperature rise to be higher than 50 degree C./sec can be checked by, for example, sampling a temperature rate and a temperature every 0.1 seconds.

Further, the elevation of the temperature from T1 to T2 along the elevating temperature profile may be achieved within a predetermined time. The unusual reactions of CoSi can be effectively inhibited by rapidly elevating the temperature thereof within the temperature range of from T1 to T2 within the elevating temperature profile. Further, in view of more surely inhibiting the unusual reactions, it is preferable to select the temperature ramp rate of the silicon substrate of equal to or higher than 75 degree C./sec.

Additionally, in view of more surely inhibiting the unusual reactions, it is preferable to elevate the temperature of the silicon substrate at a rate of equal to or higher than 50 degree C./sec. in the step 121, within a temperature of not lower than 400 degree C. and not higher than 600 degree C. within the elevating temperature profile, and preferably not lower than 380 degree C. and not higher than 600 degree C.

In this case, a silicon wafer, which has been sputter-processed, is disposed in a heating apparatus. Then, for example, when a temperature control is to be achieved by establishing the temperature ramp rate of the heating apparatus to a predetermined rate, the temperature of the wafer may be elevated after the temperature measurement of the wafer is enabled from a predetermined temperature within a range of, for example, from 325 degree C. to 600 degree C., at a temperature ramp rate of equal to or higher than 50 degree C./sec., or preferably at a temperature ramp rate of equal to or higher than 75 degree C./sec. Alternatively, a temperature control procedure of elevating the temperature from 325 degree C. to 600 degree C. within a predetermined seconds, which satisfies the temperature ramp rate of equal to or higher than 50 degree C./sec., may also be employed. More specific features of the temperature control will be described in second embodiment.

While the exemplary implementation of the temperature T1 and a temperature T3 as will be discussed later, both of which are higher than 350 degree C., is illustrated in FIG. 12, T1 and T3 may alternatively be equal to or lower than 350 degree C.

While the exemplary implementation of the temperature T2 of higher than 600 degree C. is illustrated in FIG. 12, it is sufficient that T2 is equal to or higher than 600 degree C. Further, in the step 121, the temperature of the silicon substrate may be elevated at a rate of equal to or higher than 50 degree C./sec., in the temperature range of from the temperature T1 to a temperature that is higher by about 20 to 30 degree C. than T2 within the elevating temperature profile. This configuration provides more surely inhibition to the unusual reactions described above.

In the step 122, the temperature of the silicon substrate is held at a predetermined temperature of equal to or higher than T2 in the elevating temperature profile for a predetermined time. The above-described predetermined temperature may be, for example, a temperature of not lower than 650 degree C. and not hither than 700 degree C. This configuration provides forming the CoSi layer on the device-forming surface with an improved stability.

Now, returning to FIG. 8 and FIG. 12, after the step 102, the silicon substrate is unloaded from the lamp annealing apparatus in the step 103.

The step 104 is a fourth operation of removing unreacted Co after the third operation that is the step 122 (FIG. 9). This operation may be, for example, a wet etching operation employing an aqueous mixture of hydrochloric acid and hydrogen peroxide.

Here, after the step 122, the silicon substrate may be exposed to an atmospheric air at a temperature of equal to or lower than 350 degree C. in the step 103, and then the processing of the step 104 may be conducted. The residual Co on the silicon substrate caused when the processing of the step 104 is conducted can be more specifically reduced, by selecting the temperature of the unloaded silicon substrate after the first sintering at a temperature of not higher than 350 degree C.

The second sintering operation of the step 105 is a fifth operation of forming a layer of monocobalt disilicide ($CoSi_2$) on the device-forming surface of the silicon substrate after conducting the step 104 by heating the silicon substrate to a temperature T4 that is higher than the temperature T2. The second sintering is conducted under the temperature condition of higher than the highest reachable temperature of the silicon substrate in temperatures employed in the first sintering, so that the $CoSi_2$ layer, which is the further stabilized cobalt silicide layer, is formed on the device-forming surface of the silicon substrate. In addition to above, T4 may be selected to be a temperature for achieving a stable formation of the $CoSi_2$ layer, and for example, a temperature of around 750 to 850 degree C.

In the present embodiment, the unusual reactions can be effectively inhibited by rapidly heating the silicon substrate, when the temperature profile for heating the silicon substrate proceeds through a temperature range for possibly causing unusual reactions of CoSi, or in other words, through the temperature range of from T1 to T2 in the step 121. CoSi may also be formed on the device-forming surface in the step 121, and in such case, elevating the temperature through the temperature the profile from T1 to T2 should be completed as immediately as possible to achieve a level of the inhibition in causing the unusual reaction thereof that provides a practical use of the device.

Although it is described in “Properties of Metal Silicides”, Edited by KAREN MAEX and MARC VAN ROSSUM, INSPEC (UK), 1995, pp. 65 that the temperature for converting Co to $Co_2Si$ is around 250 degree C. and the temperature for converting $Co_2Si$ to CoSi is around 350 degree C., in reality, the reaction for forming CoSi depends on a base underlying thereof, and therefore T2 is selected to be equal to or higher than 600 degree C. This is because the value of T2 should be selected in view of providing a safe temperature region where the unusual reaction is inhibited regardless of conditions of the base underlying thereof. According to the investigations of the present inventors, it is empirically confirmed that the unusual reaction is inhibited regardless of conditions of the base underlying thereof by selecting the temperature T2 of equal to or higher than 600 degree C.

Thus, the CoSi layer is formed at a predetermined temperature of equal to or higher than T2, or more specifically at a predetermined temperature of equal to or higher than 600 degree C., so that the CoSi layer is stably formed on the device-forming surface of the silicon substrate. This is because unusual reaction in the reaction forming CoSi is not caused and CoSi is rather stably formed at a temperature within the temperature range of equal to or higher than T2. When the temperature range of equal to or higher than 600 degree C. in the elevating temperature profile is selected, the reaction for forming CoSi is surely completed over the entire device-forming surface. If the reaction for forming CoSi is surely completed over the entire device-forming surface, a formation of $CoSi_2$ may be permitted on some region of the silicon wafer.

In the above-mentioned procedure, after forming the Co layer or the $Co_2Si$ layer in the sputter apparatus in the step 101 and before conducting the first sintering operation of the step 102, the silicon substrate may be exposed to an atmospheric air for transferring the silicon substrate to the lamp annealing apparatus. In addition, in this case, the temperature of the silicon substrate may be decreased to a temperature of equal to or lower than T1. In such case, the silicon substrate is heated once again from the temperature of equal to or lower than T1 in the lamp annealing apparatus (S121).

Figure 10:
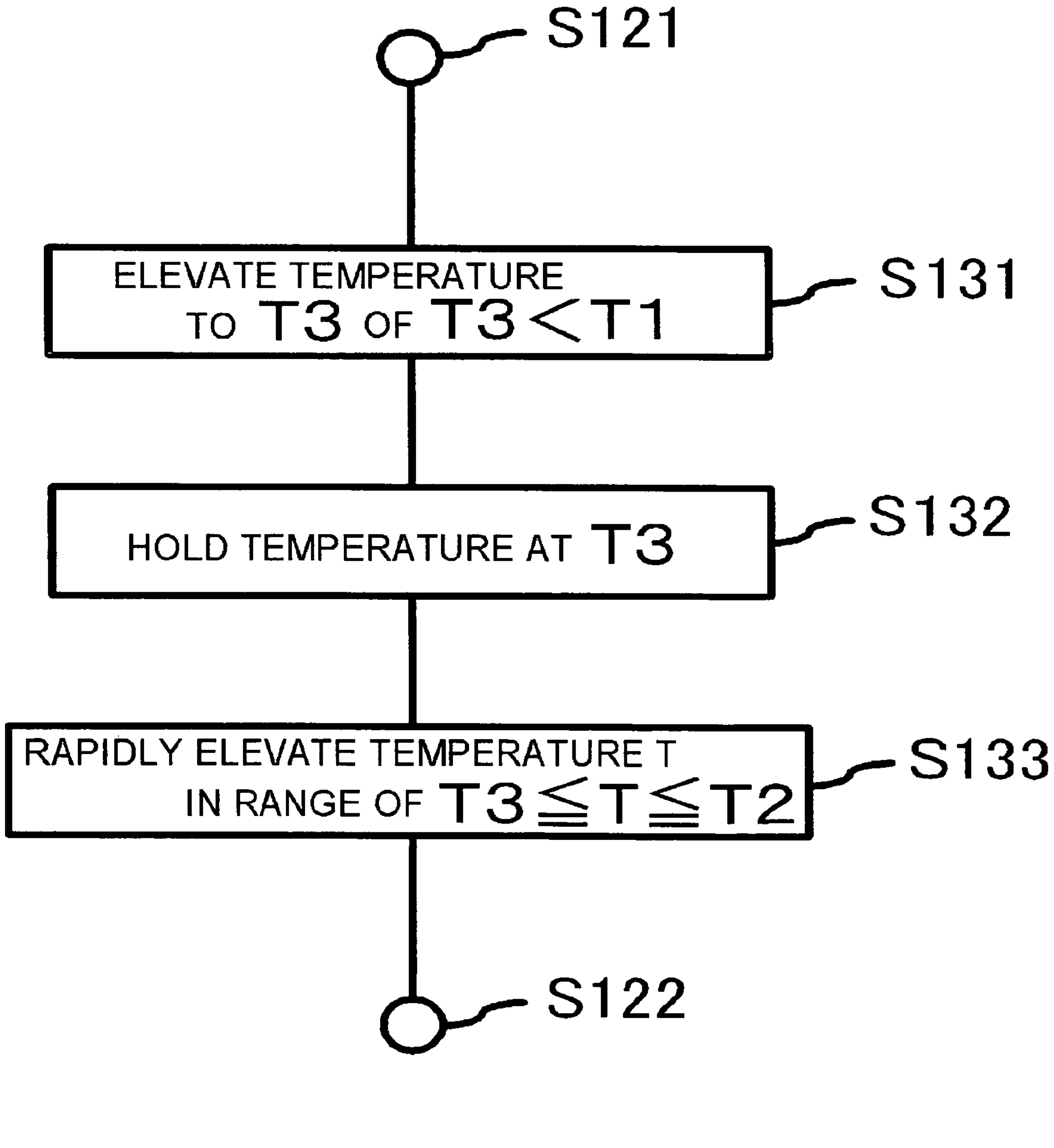
FIG. 10 is a flow chart, illustrating a procedure for manufacturing the semiconductor device according to the embodiment of the present invention.

In this case, the operation of elevating the temperature thereof in the step 121 may be conducted in accordance with the procedure shown in FIG. 10. FIG. 10 is a flow chart, illustrating the step 121 of FIG. 9 in further detail. As shown in FIG. 10, the step 121 includes:

step 131: elevating the temperature of the silicon substrate to a predetermined temperature T3 of less than T1;

step 132: holding the temperature of silicon substrate at the temperature T3; and step 133: after the step 132 of holding the temperature at T3, elevating the temperature of the silicon substrate at a rate of equal to or higher than 50 degree C./sec., in the temperature range of from the temperature T2 to the temperature T3 in the elevating temperature profile.

After holding the temperature of silicon substrate at the temperature T3 that is lower than T1 in the step 132, the operation of elevating temperature thereof is conducted in the step 133, so that the conditions of heating the silicon substrate can be more surely controlled. Since the temperature is not held at a temperature that higher than T1 in this case, the unusual reaction of CoSi can be inhibited. Consequently, an increase in the sheet resistance of the silicide layer and/or a generation of the junction leakage current in the diffusion layer underlying the silicide layer can be inhibited.

Here, the temperature T3 of the silicon substrate held in the profile may be suitably selected depending upon the highest reachable temperature T1 in the sputter operation of the step 101, and the temperature T3 held in the profile may be around 350 to 380 degree C., when, for example, the sputter process is conducted at a temperature of around 400 degree C. Alternatively, a procedure as will be discussed later in second embodiment may be employed to select the holding temperature in the profile of around 300 to 350 degree C.

In such case, the holding temperature region in the temperature profile falls within the temperatures that are lower than the maintaining temperature in the conventional temperature maintaining operation described above in the description of the related art. Methods for holding the temperature of the silicon substrate at such temperature includes a method for controlling a temperature of the silicon substrate having a Co layer formed thereon by monitoring the temperature thereof. This method will be described in further detail later in second embodiment.

While the exemplary implementation of employing the high-temperature sputter operation as the step 101 has been described in the above description, the sputter temperature is not particularly limited, and a low-temperature sputter may also be employed. Here, the high-temperature sputter means a sputter process conducted at a temperature that enables forming a $Co_2Si$ layer on a device-forming surface of a silicon substrate, and more specifically, a sputter process conducted at a temperature of, for example, around 340 to 400 degree C. Besides, the low-temperature sputter means a sputter process conducted at a temperature, at which a formation of a $Co_2Si$ layer is not induced. The low-temperature sputter is conducted at a temperature of, for example, around 100 to 200 degree C.

Figure 11:
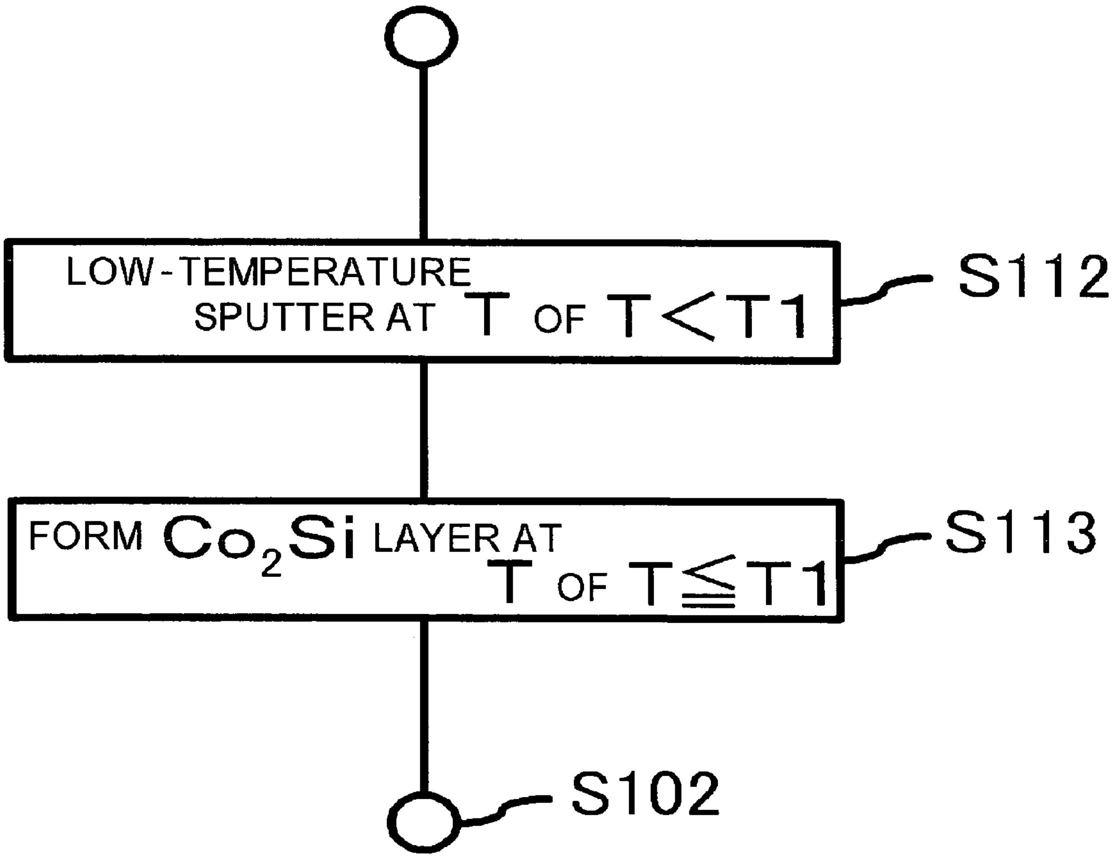
FIG. 11 is a flow chart, illustrating a procedure for manufacturing the semiconductor device according to the embodiment of the present invention.

FIG. 11 is a flow chart, illustrating a detailed procedure of the step 101 of FIG. 8 for conducting a low-temperature sputter.

As shown in FIG. 11, a sputter operation of the step 101 includes:

step 112: depositing Co on the aforementioned device-forming surface of the silicon substrate at a predetermined temperature of lower than the temperature T1 to form a Co layer; and step 113: elevating the temperature of the silicon substrate having Co deposited thereon up to the temperature T1 to form a $Co_2Si$ layer.

In step 113, the temperature of the silicon substrate may be held at a temperature within a range of from (T1−50) degree C. to T1 degree C. to form a $CoSi_2$ layer.

Since the temperature thereof is rapidly elevated within the temperature range of from T1 to T2 in the elevating temperature profile after the step 113 in the first sintering operation described above when the procedure shown in FIG. 11 is employed, the unusual reactions that are otherwise possibly caused in the reaction for forming CoSi can be inhibited. Consequently, the silicide layer can be stably formed on the surface of the silicon substrate.

SECOND EMBODIMENT

In the present embodiment, the manufacture of the transistor by employing the process for manufacturing the semiconductor device described in first embodiment will be further described in more detail. While an exemplary implementation of forming a complementary metal oxide semiconductor field effect transistor (CMOSFET) on a silicon substrate is described, conductivity type and number of transistor(s) are not particularly limited, and a predetermined number of transistor(s) having respective predetermined conductivity type (s) may be provide on the silicon substrate.

First of all, a configuration of lamp annealing apparatus of the present embodiment will be described on the basis of a schematic cross-sectional view in FIG. 1 and a functional block diagram of FIG. 2.

Figure 1:
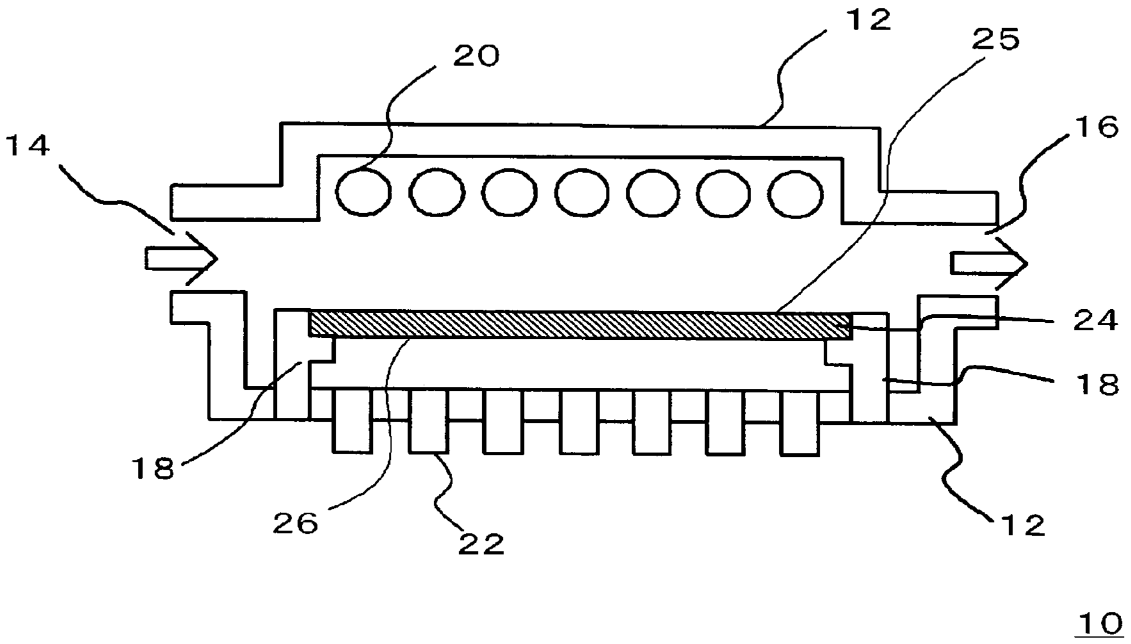
FIG. 1 is a schematic cross-sectional view, schematically illustrating a lamp annealing apparatus according to an embodiment of the present invention.
Figure 2:
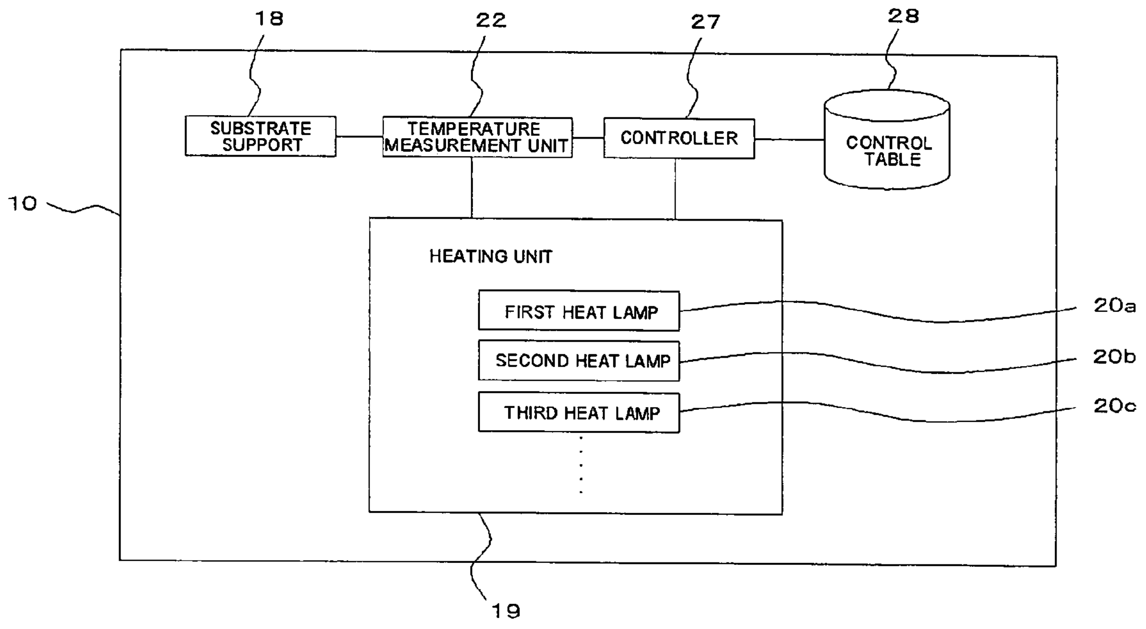
FIG. 2 is a functional block diagram of the lamp annealing apparatus according the embodiment of the present invention.

As shown in FIG. 1 and FIG. 2, a lamp annealing apparatus 10 includes: a chamber 12 for containing a silicon substrate 24 having cobalt deposited thereon; a plurality of heat lamps 20 provided in the chamber 12 and respectively configured to heat different regions of the silicon substrate 24 from the side of a principal surface 25 thereof having cobalt deposited thereon; a plurality of temperature measurement units 22 provided in the chamber 12 and respectively configured to optically measure temperatures of different regions of the silicon substrate 24 that has been heated by the heat lamp 20 from the side of the back surface 26 of the silicon substrate 24; and a controller 27, which is capable of acquiring the temperatures of the silicon substrate 24 measured by the temperature measurement units 22 and controlling outputs of heat lamps 20 based on the measured temperatures.

The lamp annealing apparatus 10 may further comprise a control table 28. The control table 28 is referred to when the outputs of a plurality of heat lamps 20 are controlled. The controller 27 is capable of executing the temperature profile shown in FIG. 5 by referring to the control table 28.

The chamber 12 has a structure that can be sealed from the external air during the wafer processing, and further includes a gas introducing unit 14 for introducing a process gas into the chamber 12 and a gas exhausting unit 16 for exhausting the process gas. A substrate support 18, which is capable of supporting the silicon substrate 24 from the side of the lower surface (back surface), is provided in the interior of the chamber 12. Here, illustrations of the driving division for rotating the substrate support 18 is not presented.

A plurality of heat lamps 20 are provided in the upper portion in the interior of the chamber 12, so as to be substantially parallel to the principal surface 25 of the silicon substrate 24. This configuration achieves heating different regions of the silicon substrate 24 from the side of the principal surface 25. In addition to above, in the block diagram of FIG. 2, the heating unit 19 comprises a plurality of heat lamps 20 such as a first heat lamp 20*a*, a second heat lamp 20*b* and a third heat lamp 20*c*, and the like.

A pyrometer may be employed for the temperature measurement unit 22. A plurality of temperature measurement units 22 are provided in the lower portion in the interior of the chamber 12, so as to be substantially parallel to the back surface 26 of the silicon substrate 24. This configuration achieves different regions of optically measuring temperatures of different regions of the silicon substrate 24 that has been heated by the heat lamp 20 from the side of the back surface 26 of the silicon substrate 24.

The controller 27 acquires the temperatures measured by the temperature measurement unit 22, and also accesses the control table 28. The controller 27 conducts a control of the heating unit 19 by conducting an administration of a ratio of time for ON/OFF of a plurality of heat lamps 20 while referring to the control table 28 as discussed later. This configuration provides a control of the output of the heat lamp 20 based on the measured temperature of the temperature measurement unit 22, thereby executing the temperature profile of FIG. 5.

The control table 28 includes a plurality of sequences, and is configured to be executed by selecting an ID number. The sequence is associated with a predetermined ID number, and includes temperature conditions of silicon substrate 24 measured by the temperature measurement unit 22, temperature-holding time of the silicon substrate 24, time required for the operation and the like. The controller 27 can provide a control of a plurality of heat lamps 20 by accessing the control table 28, acquiring information corresponding to the ID number from the control table 28 and executing the sequence. This configuration provides an execution of the temperature profile of FIG. 5.

The lamp annealing apparatus 10 having such configuration is configured to sequentially executing the following operation (a), operation (b), and operation (c).

The operation (a) is an operation of elevating the temperature of the silicon substrate 24 disposed within the chamber 12 by the heat lamps 20 until the temperature measurement by the temperature measurement unit 22 is enabled.

More specifically, the temperature is elevated without a feedback of the measured temperature to the controller 27 or the control table 28. Since cobalt is deposited on the principal surface 25 of the silicon substrate 24 in the present embodiment, the measurable temperature by the temperature measurement unit 22 can be reduce to the range of from about 300 degree C. to 350 degree C. In the operation (a), the time taken for reaching such temperature range is not particularly limited. When one or more temperature measurement unit(s) 22 detects a temperature (about 300 degree C. to 350 degree C.), then the controller 27 proceeds the process to the operation (b). Number of the temperature measurement unit(s) 22 that detects the temperature is not particularly limited if the number is equal to or larger than one, and all of the temperature measurement units 22 may be included.

The operation (b) is an operation of stabilizing the temperature of the silicon substrate 24 by controlling the outputs of the heat lamps 20 with the aforementioned controller 27, based on the temperature of the silicon substrate 24 measured by the temperature measurement unit 22, to maintain the temperature of the silicon substrate 24 at around the aforementioned temperature.

In the operation (b), the controller 27 acquires the temperature of the silicon substrate 24 measured by temperature measurement unit 22, and controls a ratio of time for ON/OFF of a plurality of heat lamps 20 while referring to the control table 28. This configuration achieves the output control of a plurality of heat lamps 20, so that the temperature of the silicon substrate 24 can be held within a temperature range of from about 300 degree C. to 350 degree C. for a predetermined time. By stabilizing the temperature of the silicon substrate 24 within such temperature range, the sheet resistance of the cobalt silicide layer is reduced and further the junction leakage current is also reduced.

The operation (c) conducted after the operation (b) is an operation of activating the heat lamps 20 if the aforementioned controller 27 determines that the temperature of the silicon substrate 24 becomes in a stable state, such that the temperature of the silicon substrate 24 is elevated to a temperature that is equal to or higher than the aforementioned stable temperature, while confirming the temperature of the silicon substrate 24.

In the operation (c), the temperature thereof is elevated within the temperature range of from 300 degree C. to 600 degree C., without holding the temperature of the silicon substrate 24. Here, the lower limit of the temperature range may be appropriately changed, depending on the temperature held in the operation (b) (around 300 degree C. to around 350 degree C.). Here, "without holding the temperature" means that the temperature of the silicon substrate 24 is elevated at a rate of 50 degree C./sec. By elevating the temperature within temperature range in the temperature profile, the sheet resistance of the obtained silicide layer is reduced and further a silicide-spike or a cohesion is not generated in the diffusion layer, thereby preventing a generation of a junction leakage current. While the upper limit of the temperature ramp rate is not particularly limited, the temperature ramp rate may be equal to or lower than 150 degree C./sec., in view of the above-described advantageous effects.

The following procedure is employed for forming a cobalt silicide layer on the silicon substrate 24 by employing such type of lamp annealing apparatus 10.

First, the silicon substrate 24 will be described in reference to figures. A schematic cross-sectional view of the silicon substrate 24 having an n-type field effect transistor (FET) and a p-type FET formed therein is illustrated in FIG. 3.

Figure 3:
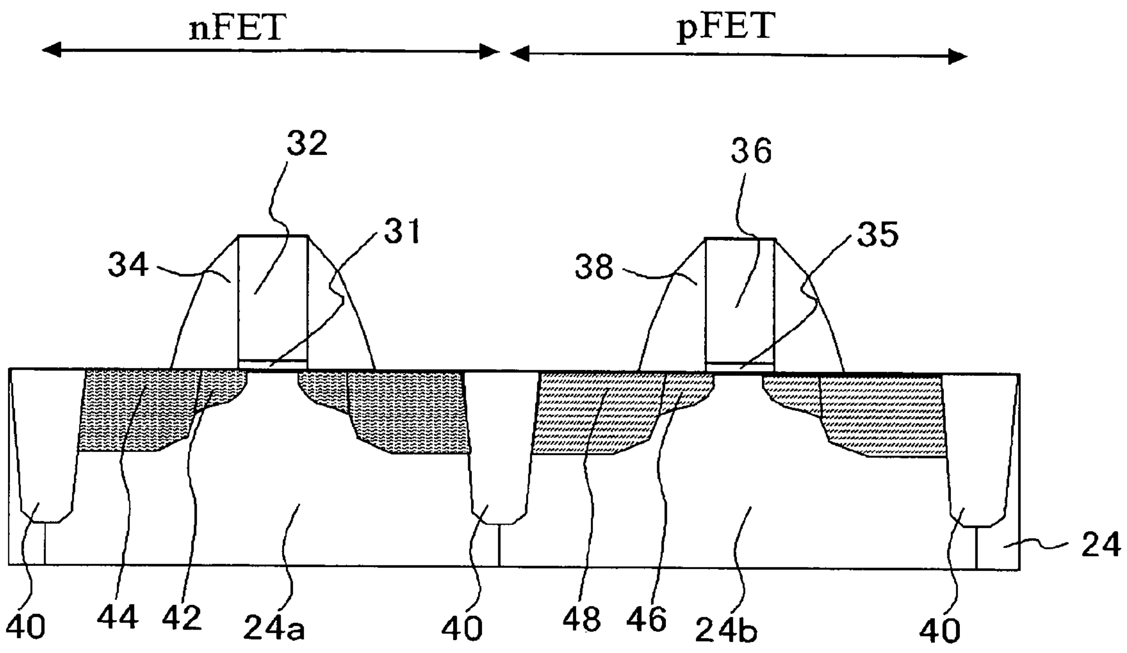
FIG. 3 is a schematic cross-sectional view, schematically illustrating a silicon substrate comprising an n-type FET and a p-type FET employed in the embodiment of the present invention.

As shown in FIG. 3, an n-type FET and a p-type FET are formed in silicon substrate 24, and these are isolated by a device isolation layer 40 formed by a shallow trench isolation (STI). The type of the material for the silicon substrate 24 is not particularly limited, and the silicon substrate 24 may be a silicon-on-insulator (SOI) substrate, or may include an epitaxial layer.

In the n-type FET, a p-well **24*a* is formed in the silicon substrate 24. The surface of the p-well 24*a* is provided with a first gate oxide film 31 and the first gate electrode 32, which are stacked thereon in this order. An n-type extension region 42 and an n-type source/drain region 44 are formed in the surface regions of the p-well 24*a* located in both sides of the first gate electrode 32. Further, a first side wall 34 is formed on the side wall of the first gate oxide film 31 and the first gate electrode 32**.

On the contrary, in the p-type FET, an n-well **24*b* is formed in the silicon substrate 24. The surface of the n-well 24*b* is provided with a second gate oxide film 35 and a second gate electrode 36, which are stacked thereon in this order. A p-type extension region 46 and a p-type source/drain region 48 are formed in the surface regions of the n-well 24*b* located in both sides of the second gate electrode 36. Further, a second side wall 38 is formed on the side wall of the second gate oxide film 35 and the second gate electrode 36**.

To form the n-type source/drain region 44, an n-type impurity is first implanted into the surface region of the silicon substrate 24 through the mask of the first side wall 34. In the present embodiment, the conditions of the ion implantation may be, for example, ion species: arsenic (As), accelerating voltage: 5 to 30 keV, and dose level: 1 to $5\times10^{15}/cm^2$. Thereafter, an activation processing is conducted to form the n-type source/drain region 44. Similarly, to form the p-type source/drain region 48, a p-type impurity is first implanted into the surface region of the silicon substrate 24 through the mask of the second side wall 38. In the present embodiment, the conditions of the ion implantation may be, for example, ion species: boron (B), accelerating voltage: 1 to 5 keV, and dose level: 1 to $5\times10^{15}/cm^2$. Thereafter, an activation processing is conducted to form the p-type source/drain region 48.

First, the silicon substrate 24 having such structure is employed, and cobalt s deposited on the surface of the silicon substrate 24 with an ordinary sputter apparatus. When cobalt is deposited, heating may be conducted by employing a back heater provided in the sputter apparatus.

Then, the silicon substrate 24 having cobalt deposited thereon is loaded in the chamber 12 through an entrance gate (not shown) provided in the lamp annealing apparatus 10, and the loaded silicon substrate 24 is mounted on a pair of substrate supports 18. Subsequently, a process gas such as nitrogen gas is introduced in chamber 12 from a gas inlet 14. Oxygen concentration in the chamber 12 is measured by a certain measuring apparatus (not shown), and if oxygen concentration is equal to or lower than a specified value, the silicon substrate 24 is heated by the heat lamps 20 to start an annealing process (first sintering). Once the silicon substrate 24 is heated to a predetermined temperature, the annealing process is conducted while confirming the temperature of the silicon substrate 24 with a plurality of temperature measurement units 22. A cobalt silicide layer is formed on the surface of the silicon substrate 24 by conducting such annealing process. After the annealing process, the silicon substrate 24 is further cooled, and then the process gas is exhausted from the chamber 12 through a gas exhausting outlet 16, and further the silicon substrate is unloaded through the entrance gate (not shown) provided in the lamp annealing apparatus 10.

Figure 5:
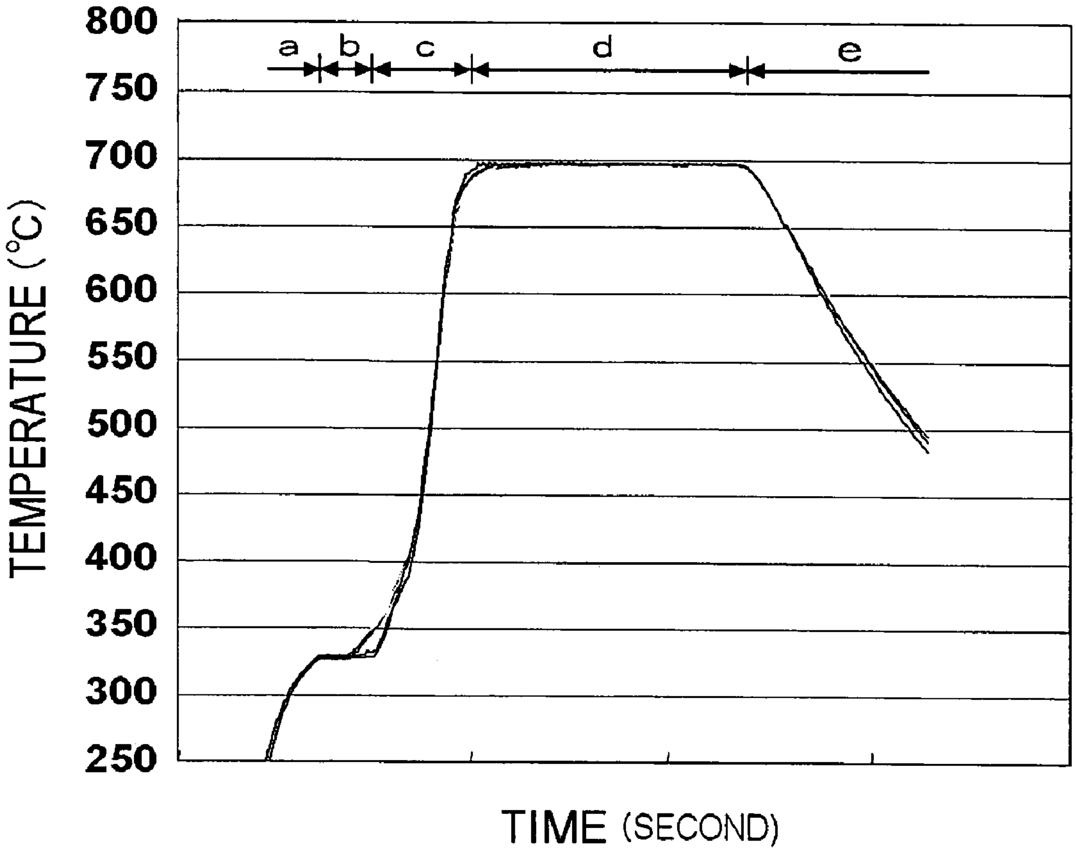
FIG. 5 a graph, schematically showing a temperature profile for an annealing process of an embodiment (first sintering)
Figure 6:
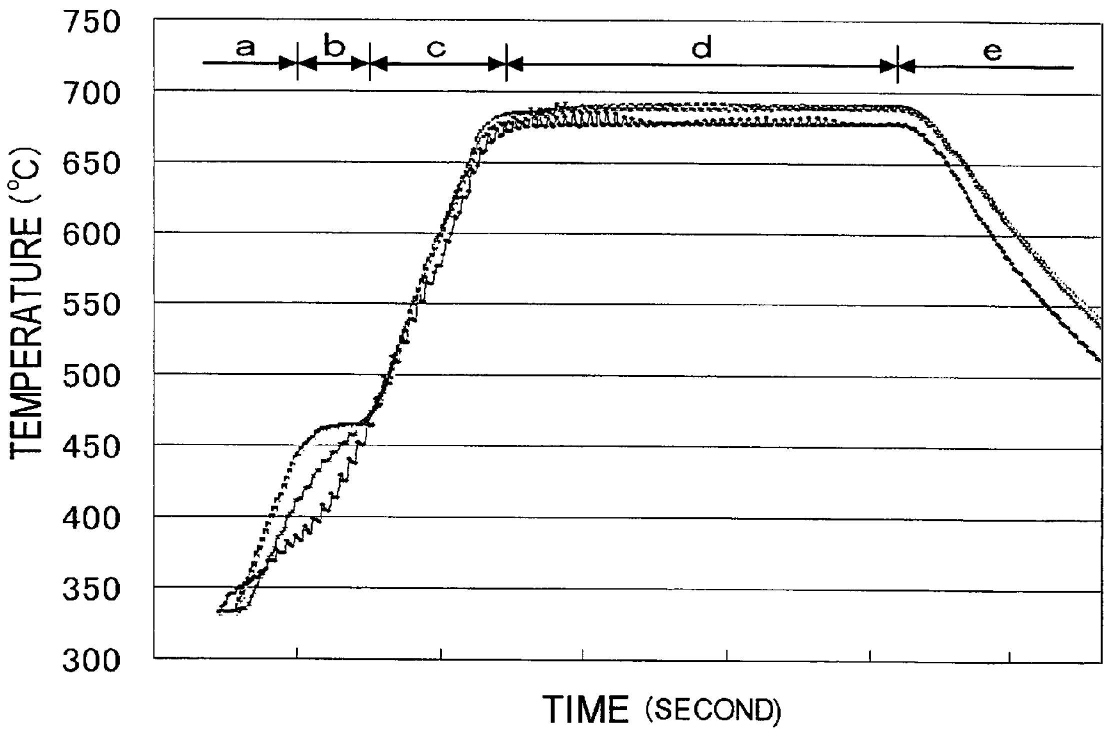
FIG. 6 is a graph, schematically showing an example of a temperature profile in the annealing process (first sintering)
Figure 7:
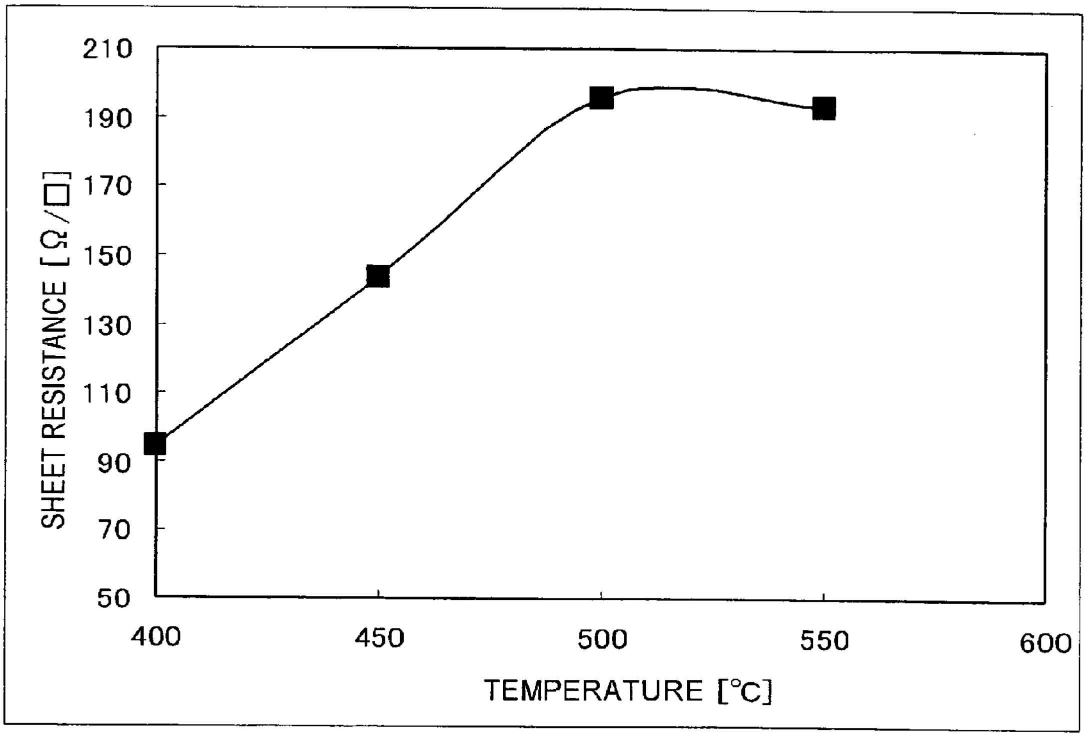
FIG. 7 is a graph, showing a relationship of an annealing temperature in the annealing process (first sintering) with a sheet resistance of the formed cobalt silicide layer in the embodiment of the present invention.

In a method for manufacturing the semiconductor device of the present embodiment, the annealing process in the lamp annealing apparatus 10 (first sintering) is conducted according to a temperature profile shown in FIG. 5. The temperature profile shown in FIG. 5 is a temperature profile of the silicon substrate 24 measured by the temperature measurement unit 22 in the operation of forming the cobalt silicide layer.

The operation of forming the cobalt silicide layer specifically includes:

(a) first operation of elevating the temperature of the silicon substrate 24 to a first temperature, at which a temperature measurement of the aforementioned silicon substrate 24 having a layer of cobalt deposited thereon is enabled to be conducted by employing the aforementioned temperature measurement unit 22 (hereinafter referred to as operation (a));

(b) second operation of holding the temperature of the silicon substrate 24 at around the aforementioned first temperature to stabilize the temperature of the silicon substrate 24 (hereinafter referred to as operation (b)); and (c) third operation of elevating the temperature of the silicon substrate 24 to a second temperature that is equal to or higher than the stabilized temperature in the operation (b) (hereinafter referred to as operation (c)).

According to the method for forming the cobalt silicide layer including such operations, the operation of holding the temperature of the silicon substrate (operation (b)) may be conducted at a level of equal to or lower than a temperature, at which unusual reaction between cobalt and silicon is induced. Therefore, the sheet resistance of the obtained silicide layer is reduced, further a silicide-spike or a cohesion is not generated in the diffusion layer, thereby preventing a generation of a junction leakage current.

In the present embodiment, after the above-described operation (a) to operation (c) are conducted, the following operations of (d) fourth operation of holding the temperature of the silicon substrate at a temperature around 650 degree C. to 700 degree C. for about 5 seconds to 30 seconds after the aforementioned operation (c) (hereinafter referred to as operation (d)); and (e) fifth operation of cooling the silicon substrate down to a predetermined temperature, after the aforementioned operation (d) (hereinafter referred to as operation (e)) may be further conducted.

The aforementioned operation (a) is a process for elevating the temperature of the silicon substrate 24 to a previously fixed temperature without conducting any feedback to the controller 27, the control table 28 or the like (open loop control). On the contrary, in the aforementioned operations (b) to (e) the temperature of the silicon substrate 24 is measured with a pyrometer, and an operational control of a plurality of heat lamps 20 is conducted while the controller 27 refers to the control table 28 based on the measured temperatures (close loop control). This configuration allows adjusting the ratio of time for ON/OFF of the heat lamps 20 to achieve the temperature control of the silicon substrate 24.

The operations (a) to (e) for forming the cobalt silicide layer in the present embodiment will be sequentially described as follows, in reference to the lamp annealing apparatus 10 show in FIGS. 1 and 2, and the temperature profile show in FIG. 5.

First of all, the temperature of the silicon substrate 24 is elevated until the measurement of the temperature of the silicon substrate 24 having cobalt deposited thereon with the temperature measurement unit 22 is enabled (operation (a)). The aforementioned operation (a) is a process for elevating the temperature of the silicon substrate 24 to a previously fixed temperature without conducting any feedback to the controller 27 or the like (open loop control).

More specifically, first of all, the silicon substrate 24 having cobalt deposited on the principal surface 25 thereof is mounted on a pair of substrate supports 18 in the chamber 12 of the lamp annealing apparatus 10. Subsequently, a process gas such as nitrogen gas and the like is introduced into the chamber 12 through the gas inlet 14. Oxygen concentration in the chamber 12 is measured by a certain measuring apparatus (not shown), and if oxygen concentration is equal to or lower than a specified value, the silicon substrate 24 is heated by the heat lamps 20. Heating by the heat lamps 20 are continued until the measurement of the temperature of the silicon substrate 24 with the temperature measurement unit 22 is enabled. Since cobalt is deposited on the principal surface 25 of the silicon substrate 24 by a sputter process in the present embodiment, the lowest available temperature for conducting the temperature measurement with the temperature measurement unit 22 can be reduced. The temperature of this silicon substrate 24 may be within a range of from about 300 degree C. to 350 degree C. The temperature measurement unit 22 attempts to measure the temperature of the silicon substrate 24 in the operation (a). When one or more temperature measurement unit(s) 22 detects a temperature (about 300 degree C. to 350 degree C.), then the controller 27 proceeds the process to the operation (b). Number of the temperature measurement unit(s) 22 that detects the temperature is not particularly limited if the number is equal to or larger than one, and all of the temperature measurement units 22 may be included.

After the operation (a), the temperature of the silicon substrate 24 is held at a temperature around the temperature that can be detected by the temperature measurement unit 22 (operation (b)). More specifically, the controller 27 conducts the output control of a plurality of heat lamps 20, so that the temperature of the silicon substrate 24 is held within a temperature range of from about 300 degree C. to 350 degree C. for a predetermined time. By stabilizing the temperature of the silicon substrate 24 within such temperature range, the sheet resistance of the cobalt silicide layer is reduced and further the junction leakage current is also reduced.

On the contrary, when a silicon substrate having an unprocessed surface is employed, the temperature, at which a temperature measurement for the silicon substrate can be conducted by a pyrometer, is within a range of from about 400 degree C. to about 500 degree C., at which the transmissivity of the silicon substrate to light is lost. If the temperature of the silicon substrate is held within such temperature range, mono cobalt mono silicide (CoSi) having higher electric resistance is formed, so that the sheet resistance of the obtained silicide layer is increased. Further, unusual reaction of cobalt with silicon in the silicon substrate is created to cause a silicide-spike and a cohesion in the diffusion layer, such that the junction leakage current is increased. Such increase of the sheet resistance or the junction leakage current becomes to be particularly considerable in recent semiconductor devices having shallower diffusion depth of an extension region.

On the contrary, since cobalt is deposited on the surface of the silicon substrate 24 of the present embodiment, the temperature, at which the transmissivity of the silicon substrate to light is lost, can be reduced. More specifically, as described above, the temperature may be within a range of from about 300 degree C. to 350 degree C. Since the temperature of silicon substrate 24 is stabilized within the above-described temperature range, a formation of mono silicide (CoSi) having higher electric resistance is inhibited, and a generation of a silicide-spike or a cohesion in the diffusion layer is also inhibited. Therefore, the sheet resistance of the cobalt silicide layer can be reduced, and further, the junction leakage current can be inhibited.

Further, control of the temperature-holding time taken for stabilizing the temperature of the silicon substrate 24 in the operation (b) may be conducted by, for example, a control based on the temperature of the silicon substrate 24 or a control based on elapsed time.

To control the temperature-holding time based on the temperature of the silicon substrate 24, the following procedure, for example, is conducted.

First, the temperature of the silicon substrate 24 is measured from the side of the back surface 26 by a plurality of temperature measurement units 22. The controller 27 acquires the measured temperature from a plurality of temperature measurement units 22. Then, the controller 27 determines whether or not the temperatures measured by a plurality of temperature measurement units 22 reach a level that is measurable with the temperature measurement unit 22, while referring to control table 28. It is sufficient that measured value(s) by one or more temperature measurement unit(s) 22 among a plurality of temperature measurement units 22 reach a level that is measurable with the temperature measurement unit 22. Number of the measured value(s) of the temperature measurement unit(s) 22 may be arbitrarily established. As a result, if it is determined that the measured value of the temperature measurement unit 22 reaches such temperature, the controller 27 controls the output of the heat lamps 20 to maintain the temperature of the silicon substrate 24 around the aforementioned temperature. This holding time is so controlled that the operation continues until the maximum difference among respective temperatures of the silicon substrate 24 measured by a plurality of temperature measurement units 22 falls within a predetermined range. Such predetermined range is a range that allows the temperature control of the whole silicon substrate 24. Such temperature range may be appropriately changed by conditions such as the nature of the cobalt silicide layer formed on the silicon substrate 24 and the like, and, for example, may be 10 degree C.

Meanwhile, to control temperature-holding time on the basis of the elapsed time in the operation (b), the following procedure, for example, is conducted.

Similarly as in the above-described procedure, if the controller 27 determines that the measured value of the temperature measurement unit 22 reaches such temperature, the controller 27 controls the output of the heat lamps 20 to maintain the temperature of the silicon substrate 24 around the aforementioned temperature. More specifically, the controller 27 controls the temperature thereof to hold it around the aforementioned temperature for a predetermined time, while referring to control table 28. Such predetermined time is within a range that allows the temperature control of the whole silicon substrate 24. Such holding time may be appropriately changed by temperature conditions and the like, and, for example, may be 5 seconds.

In such temperature-holding operation (operation (b)), by stabilizing the temperature of the silicon substrate, the temperature control of the silicon substrate 24 can be achieved.

After the operation (b), the temperature of the silicon substrate 24 is elevated up to a level that is equal to or higher than the stable temperature utilized in the operation (b) (operation (c)).

More specifically, if the aforementioned controller unit 27 determines that the temperature of the silicon substrate 24 becomes in a stable state in the temperature-holding operation (operation (b)), an administration of a ratio of time for ON/OFF of the heat lamps 20 is conducted to control the output thereof, and the elevation of the temperature of the silicon substrate 24 is started while confirming the temperature of the silicon substrate 24. Further, the controller section 27 acquires temperatures of silicon substrate 24 from temperature measurement units 22, and activates the heat lamps 20 based on the acquired results while referring to control table 28 to execute the heating process in accordance with the temperature profile.

In the operation (c), the temperature thereof is elevated within the temperature range of from 300 degree C. to 600 degree C., without holding the temperature of the silicon substrate 24. Here, the lower limit of the temperature range may be appropriately changed, depending on the temperature held in the operation (b) (around 300 degree C. to around 350 degree C.). Here, "without holding the temperature" means that the temperature of the silicon substrate 24 is elevated at a rate of 50 degree C./sec. By elevating the temperature within temperature range in the temperature profile, the sheet resistance of the obtained silicide layer is reduced and further a silicide-spike or a cohesion is not generated in the diffusion layer, thereby preventing a generation of a junction leakage current. While the upper limit of the temperature ramp rate is not particularly limited, the temperature ramp rate may be equal to or lower than 150 degree C./sec., in view of the above-described advantageous effects.

The temperature thereof is elevated within such temperature range without holding the temperature of the silicon substrate 24, so that a formation of mono silicide (CoSi) having higher electric resistance is inhibited, and a generation of a silicide-spike or a cohesion in the diffusion layer is also inhibited. Therefore, the sheet resistance of the cobalt silicide layer can be reduced, and further, the junction leakage current can be inhibited.

Here, the temperature of the silicon substrate 24 reached in the operation (c) is not particularly limited, as long as the temperature thereof is elevated within the temperature range of from 300 degree C. to 600 degree C., without holding the temperature of the silicon substrate 24. In the present embodiment, the temperature of silicon substrate 24 is reached to a level of around 650 degree to 700 degree C.

After the operation (c), the temperature of silicon substrate is held at a temperature of about 650 degree C. to 700 degree C. for about 5 to 30 seconds (operation (d)), and thereafter, the silicon substrate 24 is cooled down to a predetermined temperature (operation (e)).

Figure 4:
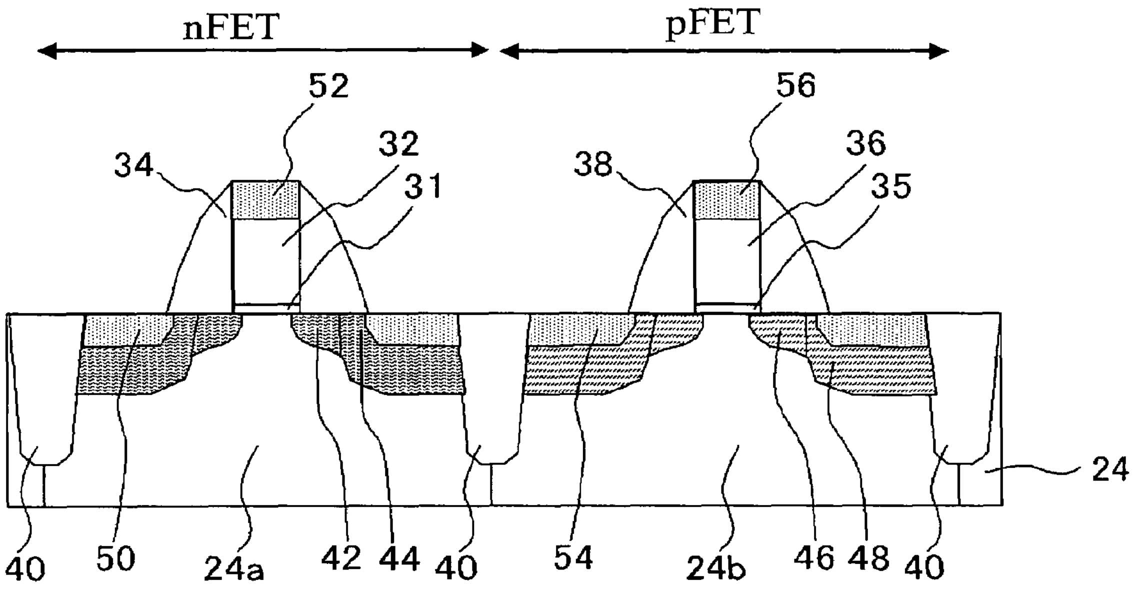
FIG. 4 is a schematic cross-sectional view, schematically illustrating the silicon substrate having a cobalt silicide layer formed thereon in the embodiment of the present invention.

After the operation (e) is completed, the process gas is exhausted from the chamber 12 through a gas exhausting outlet 16, and the silicon substrate 24 is unloaded through the entrance gate (not shown) provided in the lamp annealing apparatus 10, completing the annealing process (first sintering). Thereafter, the surface of the silicon substrate 24 is etched, and then, a predetermined annealing process (second sintering) is further conducted. As shown in FIG. 4, in the n-type FET, this configuration provides forming a cobalt silicide layer 50 in the n-type source/drain region 44 formed in the silicon substrate 24. Similarly, in the p-type FET, a cobalt silicide layer 54 is formed in the p-type source/drain region 48 formed in the silicon substrate 24. Here, cobalt silicide layers 52 and 56 are formed in surface regions of the gate electrodes 32 and 36, respectively.

In the n-type FET of the present embodiment, under the condition for considerably increasing the sheet resistance of cobalt silicide layer 50, or in other words, under the condition of employing arsenic (As), the n-type source/drain region 44 is formed, and shallower diffusion depth of the n-type source/drain region 44 is provided, so that the cobalt silicide layer 50 is formed in the surface region thereof. Nevertheless, the sheet resistance of the cobalt silicide layer 50 can be considerably reduced by employing the temperature profile of the present embodiment.

Similarly, in the p-type FET of the present embodiment, under the condition for considerably generating the junction leakage current, or in other words, under the condition of employing boron (B), the p-type source/drain region 48 is formed, and shallower diffusion depth of the p-type source/drain region 48 is provided, so that the cobalt silicide layer 54 is formed in the surface region thereof. Nevertheless, a generation of the junction leakage current can be inhibited by employing the temperature profile of the present embodiment.

After conducting the annealing process (second sintering), a predetermined operation of forming a contact, an operation of forming an interconnect or the like are conducted to manufacture a semiconductor device.

In addition, a computer program for executing an annealing operation described above (first sintering) may be recorded in a computer-readable recording medium such as hard disk, semiconductor memory, Floppy (registered trademark) disc, CD-ROM and the like, and then the computer installed in the lamp annealing apparatus 10 read and execute the stored computer program. The program controls the computer of the lamp annealing apparatus 10 and sequentially execute the operation (a), the operation (b) and the operation (c) to achieve the temperature profile of FIG. 5.

While the preferred embodiments of the present invention have been described above in reference to the annexed figures, it should be understood that the disclosures above are presented for the purpose of illustrating the present invention, and various configurations other than the above described configurations can also be adopted.

For example, the exemplary implementation of including the n-type FET and the p-type FET on the silicon substrate 24, which are disposed to be mutually adjacent, is illustrated in the present embodiment, the configuration of the present invention is not particularly limited thereto, and these FETs may be spatially separated with a predetermined interval, or alternatively, it may be sufficient to have only one of these FETs formed thereon.

In addition, number of the heat lamps 20 is not particularly limited, and any number may be available if these heat lamps 20 provide substantially uniform heating of the entire silicon substrate 24. Further, number of the temperature measurement units 22 is not particularly limited, and any number may be available if these temperature measurement units 22 provide measurements of the entire silicon substrate 24.

The present invention may also includes the following configurations.

(1) A method for manufacturing a semiconductor device, comprising:

depositing cobalt on a surface of a silicon substrate; and heating the silicon substrate with a lamp annealing apparatus to form a layer of cobalt silicide, said lamp annealing apparatus comprising a temperature measurement unit that is capable of optically measuring a temperature of the silicon substrate, wherein said heating the silicon substrate with the lamp annealing apparatus to form the layer of cobalt silicide includes:

elevating the temperature of said silicon substrate to a first temperature, at which a temperature measurement of said silicon substrate having a layer of cobalt deposited thereon is enabled to be conducted by employing said temperature measurement unit;

holding the temperature of said silicon substrate at around said first temperature to stabilize the temperature of the silicon substrate; and elevating the temperature of said silicon substrate to a second temperature that is equal to or higher than said first temperature.

(2) The method for manufacturing the semiconductor device described in the above (1), wherein said lamp annealing apparatus comprises a plurality of temperature measurement units, which is configured to allow measuring temperatures of different regions in said silicon substrate; and wherein said holding the temperature of said silicon substrate to stabilize the temperature thereof is continued, until the maximum difference among respective temperatures of said silicon substrate measured by a plurality of said temperature measurement units falls within a predetermined range, after one or more temperature(s) of the silicon substrate measured by said temperature measurement unit(s) reach said temperature, at which the temperature measurement of said silicon substrate is enabled.

(3) The method for manufacturing the semiconductor device described in the above (1), wherein said lamp annealing apparatus comprises a plurality of said temperature measurement units that are configured to allow measuring the temperatures of different regions of said silicon substrate, and wherein said holding the temperature of said silicon substrate to stabilize the temperature thereof includes holding the temperature of said silicon substrate at a temperature around said temperature for a predetermined time, after one or more temperature(s) of said silicon substrate measured by said temperature measurement unit(s) reach said temperature, at which the temperature measurement of said silicon substrate is enabled.

(4) The method for manufacturing the semiconductor device described in any one of the above (1) to (3), wherein said elevating the temperature of said silicon substrate to the second temperature includes elevating the temperature of said silicon substrate within a temperature range of 300 degree C. to 600 degree C.

(5) The method for manufacturing the semiconductor device described in any one of the above (1) to (4), wherein said elevating the temperature of said silicon substrate to the second temperature includes elevating temperature of said silicon substrate at a rate of equal to or higher than 50 degree C./sec.

(6) A computer program for instructing a lamp annealing apparatus to execute a process, said lamp annealing apparatus comprising a temperature measurement unit that is capable of optically measuring a temperature of a silicon substrate, and being configured of forming a layer of cobalt silicide by heating the silicon substrate having cobalt deposited thereon, said process including:

(a) elevating a temperature of the silicon substrate to a temperature level that enables a temperature measurement of the silicon substrate having cobalt deposited thereon with said temperature measurement unit;

(b) holding said temperature of said silicon substrate at said temperature level to stabilize the temperature of said silicon substrate; and (c) elevating temperature of the silicon substrate to a temperature level that is equal to or higher than said stabilized temperature level.

(7) A recording medium having a computer program according to the above (6) stored therein.

(8) A lamp annealing apparatus, comprising:

a chamber for disposing a silicon substrate having silicon deposited thereon;

a plurality of heat lamps, provided in said chamber, and configured of heating different regions of said silicon substrate from a side of a principal surface having cobalt deposited thereon;

a plurality of temperature measurement units, provided in said chamber, and configured of optically measuring temperatures of different regions of aid silicon substrate from a side of a back surface of said silicon substrate, said silicon substrate being heated with said heat lamps; and a controller, being capable of acquiring temperatures of said silicon substrate measured by said temperature measurement units, and controlling outputs of said heat lamps based on the acquired temperatures, wherein said lamp annealing apparatus is configured of sequentially executing:

(a) elevating the temperature of said silicon substrate disposed in said chamber by said heat lamps to a first temperature, at which a temperature measurement of said silicon substrate is enabled to be conducted by employing said temperature measurement units;

(b) controlling output of said heat lamp by said controller, based on temperatures of said silicon substrate measured by said temperature measurement units, so that the temperature of said silicon substrate is held at around said temperature to stabilize the temperature of said silicon substrate; and (c) activating said heat lamps if said controller determines that the temperature of said silicon substrate becomes in a stable state, such that the temperature of said silicon substrate is elevated to a temperature that is equal to or higher than said stabilized temperature, while confirming the temperature of said silicon substrate.

EXAMPLES

In the present example, a p-type FET (FIG. 4) was formed in a silicon substrate by employing a method described in first embodiment.

The configuration of a side of a p-type FET shown in FIG. 3 was formed in a silicon substrate 24, and then, Co was sputtered on the entire device-forming surface in a sputter apparatus at a temperature of 350 degree C. Thereafter, the silicon substrate was transferred into a lamp annealing apparatus, where first sintering processing was conducted. In the first sintering, the silicon substrate was once elevated to a temperature of 300 degree C., and then, the temperature was held at 300 degree C. for 10 seconds, which was a temperature holding operation. Thereafter, temperature-elevating operations were conducted from 300 degree C. to 700 degree C. at various temperature ramp rate. Then, the temperature was held at 700 degree C. for 60 seconds to form CoSi layer on the device-forming surface. After the first sintering, unreacted Co was removed, and further, a second sintering was conducted for 30 seconds at 750 degree C.

For transistors obtained by the above-mentioned procedure, the relationships of various temperature ramp rates from 300 degree C. to 600 degree C. with anomalous leakage generation rates of formed transistors were evaluated. In addition to above, in the present example, respective anomalous leakage generation rates of transistors having junction depths of source/drain region provided in the silicon substrate of 120 nm and 100 nm were evaluated respectively.

Figure 13:
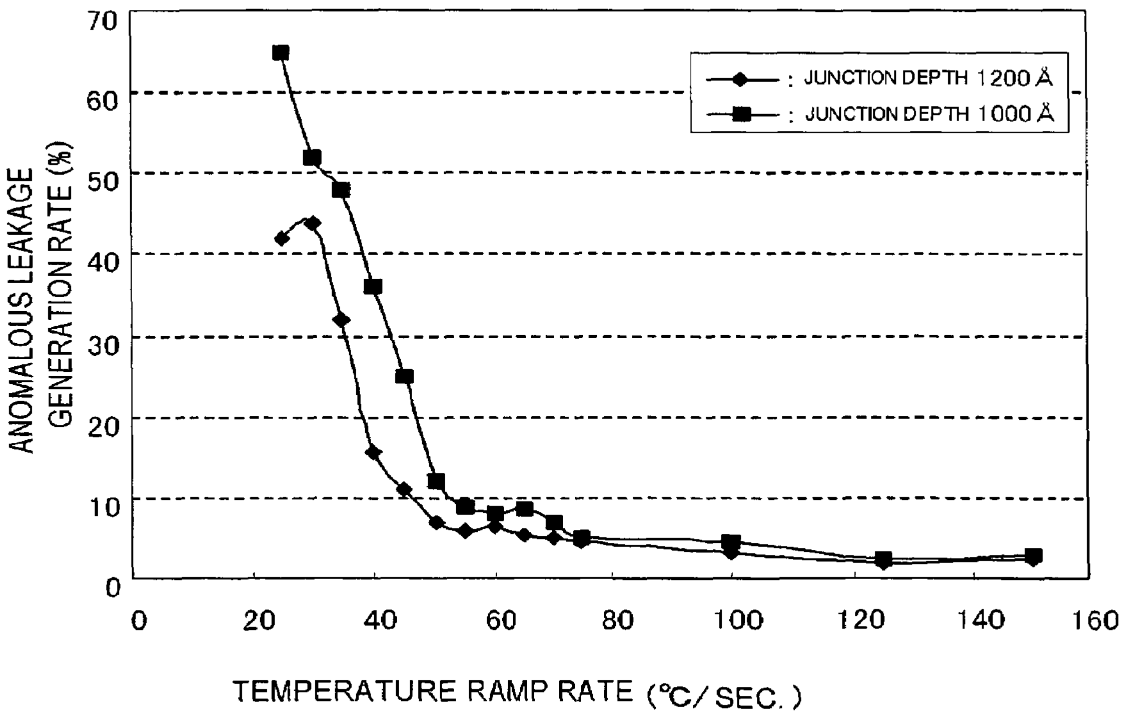
FIG. 13 is a graph, showing a relationship of a temperature ramp rate with an anomalous leakage generation rate in manufacturing a transistor in an example.

FIG. 13 is a graph, showing a relationship of an elevating temperature rate in first sintering (degree C./sec.) with an anomalous leakage generation rate in the obtained transistor (%). As can be seen from FIG. 13, it can be understood in both cases of having the junction depths of 120 nm and 100 nm, that the generation rate of anomalous leakage is reduced by selecting the temperature ramp rate in the temperature range of 300 degree C. to 600 degree C. at a rate of equal to or higher than 50 degree C./sec.

Further, in the formation of the transistor employing the above-described process, under the condition of the sputter temperature for Co of 395 degree C., relationships of the holding temperatures in the first sintering with the anomalous leakage generation rate of the obtained transistors were evaluated. After attaining the holding temperature in the temperature profile, the temperature of the silicon substrate was elevated to 680 degree C. at a temperature ramp rate of 75 degree C./sec., and then, the temperature of the silicon substrate was held at 680 degree C. to form a CoSi layer.

According to the results, it was confirmed that anomalous leakage generation rate of the transistors was reduced to not higher than 10%, when the temperature was held at a temperature of 350 degree C. and 380 degree C. In addition, the sheet resistances of the transistors obtained in the above-described example were quite lower, which cause no problem in practical use. On the contrary, it was also confirmed that the anomalous leakage generation rate of the transistor was increased to around 40% when the temperature was held at 450 degree C.

While the p-type FET was featured in the above-described example, similar results were also obtained in the case of n-type FET.

It is apparent that the present invention is not limited to the above embodiment, that may be modified and changed without departing from the scope and spirit of the invention.

What is claimed is:

1. A method for manufacturing a semiconductor device, comprising:

forming a layer of cobalt (Co) or a layer of dicobalt monosilicide (Co2Si) on a device-forming surface of a silicon substrate in a sputter apparatus, by utilizing a predetermined temperature profile;

after said forming the layer of Co or Co2Si, elevating a temperature of said silicon substrate to a predetermined temperature T2, which is equal to or higher than 600 degree C.; and after said elevating the temperature of the silicon substrate to T2, forming a layer of monocobalt monosilicide (CoSi) on said device-forming surface of said silicon substrate at a temperature within a range of equal to or higher than T2, wherein, in said elevating the temperature of said silicon substrate to T2, within a temperature range between a highest reachable temperature T1 of said silicon substrate in said forming the layer of Co or Co2Si and said temperature T2, a temperature of said silicon substrate is elevated at a temperature ramp rate of equal to or higher than 50 degree C./sec.

2. The method for manufacturing the semiconductor device according to claim 1, wherein both of said elevating the temperature of said silicon substrate to T2 and said forming the layer of CoSi are conducted within a lamp annealing apparatus.

3. The method for manufacturing the semiconductor device according to claim 1, wherein said forming the layer of Co or Co2Si includes depositing Co on said device-forming surface of said silicon substrate at a temperature of not lower than (T1−50) (degree C.) and not higher than T1 (degree C.).

4. The method for manufacturing the semiconductor device according to claim 1, wherein said forming the layer of Co or Co or Co2Si includes:

depositing Co on said device-forming surface of said silicon substrate at a predetermined temperature of lower than T1 to form said layer of Co; and elevating the temperature of said silicon substrate having said layer of Co deposited on said silicon substrate to the temperature T1 to form said layer of Co or Co2Si.

5. The method for manufacturing the semiconductor device according to claim 1, wherein said elevating the temperature of said silicon substrate to T2 comprises:

elevating the temperature of said silicon substrate to a predetermined temperature T3, which is lower than T1; holding the temperature of said silicon substrate to be at a temperature T3; and after said holding the temperature of said silicon substrate to the temperature T3, elevating the temperature of said silicon substrate within a temperature range between T2 and T3 at a temperature ramp rate of equal to or higher than 50 degree C./sec.

6. The method for manufacturing the semiconductor device according to claim 1, wherein, in said elevating the temperature of said silicon substrate to the temperature T2, the temperature of said silicon substrate is elevated within a temperature range between 400 degree C. and 600 degree C., both ends inclusive, at a temperature ramp rate of equal to or higher than 50 degree C./sec.

7. The method for manufacturing the semiconductor device according to claim 1, further comprising:

after said forming the layer of CoSi, removing unreacted Co; and after said removing unreacted Co, elevating the temperature of said silicon substrate to a temperature T4, which is higher than T2, to form a layer of monocobalt disilicide (CoSi2) on said device-forming surface.

8. The method for manufacturing the semiconductor device according to claim 7, wherein, after conducting said forming the layer of CoSi, said silicon substrate is exposed to an atmospheric air at a temperature of equal to or lower than 350 degree C., and then, said removing unreacted Co is conducted.

* * * * *

UNITED STATES PATENT AND TRADEMARK OFFICE

CERTIFICATE OF CORRECTION

PATENT NO. : 7,585,771 B2
APPLICATION NO. : 11/409061
DATED : September 8, 2009
INVENTOR(S) : Matsuda et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 215 days.

Signed and Sealed this

Fourteenth Day of September, 2010

David J. Kappos

*Director of the United States Patent and Trademark Office*